United States Patent [19]

Adey

[11] 3,965,877
[45] June 29, 1976

[54] FREQUENCY TO VOLTAGE CONVERTERS

[75] Inventor: Anthony John Adey, Slough, England

[73] Assignee: C.A.V. Limited, Birmingham, England

[22] Filed: May 14, 1975

[21] Appl. No.: 577,357

[30] Foreign Application Priority Data
May 31, 1974 United Kingdom............... 24212/74

[52] U.S. Cl............................ 123/139 E; 123/102; 307/271; 328/127
[51] Int. Cl.².................... F02M 39/00; F02D 1/04
[58] Field of Search............... 123/139 E, 102, 118; 307/271, 233 R; 328/127, 140

[56] References Cited
UNITED STATES PATENTS

| | | | |
|---|---|---|---|
| 3,512,013 | 5/1970 | Calfee................................. | 328/140 |
| 3,772,533 | 11/1973 | Bruckner............................ | 328/127 |
| 3,867,918 | 2/1975 | Williams........................... | 123/139 E |
| 3,886,921 | 6/1975 | Hafner............................. | 123/139 E |

*Primary Examiner*—Charles J. Myhre
*Assistant Examiner*—Ronald B Cox

[57] ABSTRACT

A frequency to voltage converter includes an operational amplifier having its non inverting input terminal connected to a supply line which has a voltage intermediate a pair of supply terminals for the amplifier, a resistor connected in series with first and second diodes between the inverting input terminal and the line a first capacitor through which the input of the converter is connected to a point intermediate the diode and a second capacitor connected between the junction of the first diode and the resistor and one of the supply lines, a feed back resistor connected between the output terminal of the amplifier and the junction of the first diode and the resistor and a third capacitor connected between the output and inverting input terminals of the amplifier.

4 Claims, 1 Drawing Figure

U.S. Patent June 29, 1976 3,965,877
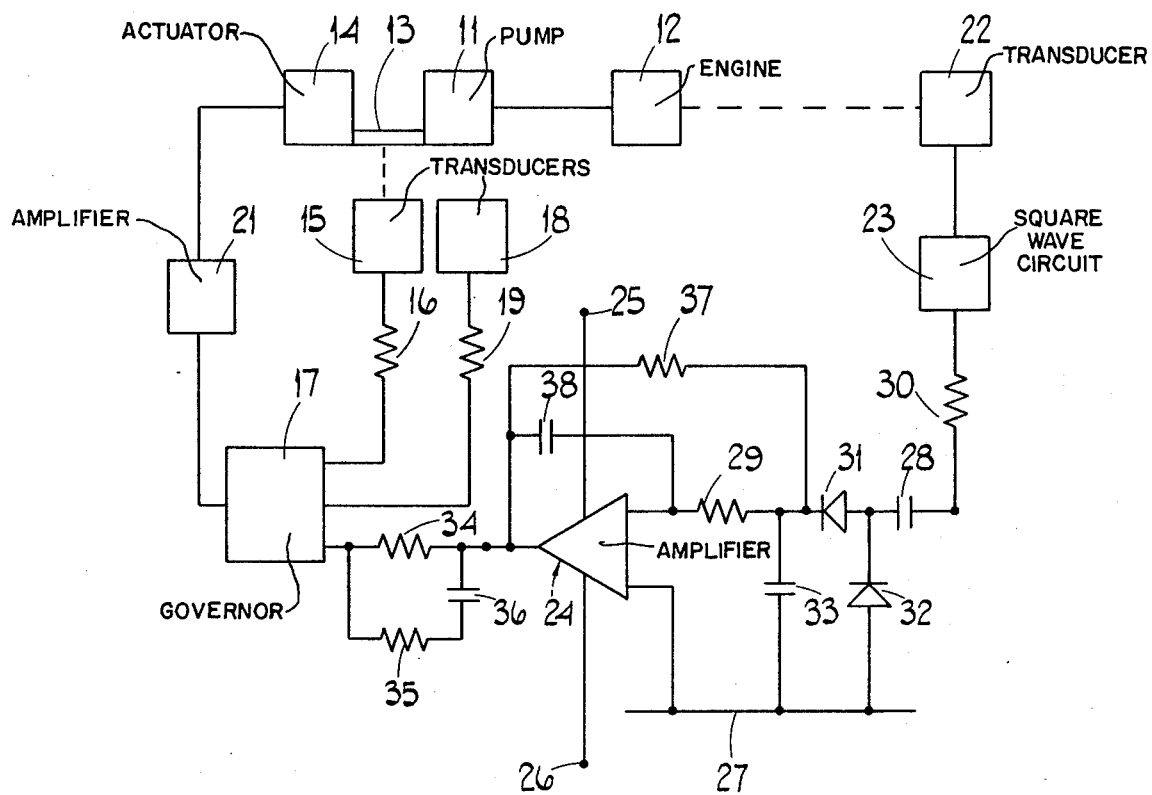

FREQUENCY TO VOLTAGE CONVERTERS

This invention relates to frequency to voltage converters, and also to fuel supply systems for engines using such converters.

In one aspect, the invention resides in a frequency to voltage converter, comprising in combination an input terminal to which an a.c. signal is fed, an operational amplifier which is powered by first and second supply lines, and has its non-inverting input terminal connected to a third supply line at a potential between the potentials of the first and second lines, the output from the converter being taken from the output terminal of the operational amplifier, a resistor connected in series with first and second similarly poled diodes between the inverting input terminal of the amplifier, and the third line, a first capacitor connected between the input terminal and the junction of the diodes, a second capacitor connected between the junction of the first diode and the resistor and one of the supply lines, a feedback resistor connected between the output terminal of the amplifier and the junction of the first diode and resistor, and a third capacitor connecting the output and inverting input terminals of the amplifier.

In another aspect, the invention resides in a fuel supply system for an engine, comprising in combination a pump supplying fuel to the engine, a first transducer measuring pump output, a second transducer measuring demand, transducer means measuring engine speed, and an electronic governor to which the signals from the first and second transducers and the transducer means are supplied, the governor controlling the pump output, said transducer means comprising a pulse generator producing pulses at a frequency dependent upon the rotational speed of the engine, an operational amplifier which is powered by first and second supply lines, and has its output terminal connected to the governor and its non-inverting input terminal connected to a third supply line at a potential between the potentials of the first and second lines, a resistor connected in series with first and second similarly poled diodes between the inverting input terminal of the amplifier and the third line, a first capacitor connected between the output of the pulse generator and the junction of the diodes, a second capacitor connected between the junction of the first diode and the resistor and one of the supply lines, a feedback resistor connected between the output terminal of the amplifier and the junction of the first diode and resistor, and a third capacitor connecting the output and inverting input terminals of the amplifier.

In one arrangement, the operational amplifier provides an input to the governor by way of a resistor, and the resistor is bridged by a differentiating circuit so that a derivative term is also fed to the governor.

The accompanying drawing is a circuit diagram, partly in block form, illustrating one example of the invention.

Referring to the drawing, a pump 11 supplies fuel to an engine 12 driving a road vehicle. The output of the pump 11 is determined by a control rod 13 the position of which is set by an electromechanical actuator 14. The position of the control rod 13 is measured by a transducer 15 which provides an input by way of a resistor 16 to an electronic governor 17, and a further transducer 18 measures demand, which is normally set by the accelerator pedal of the vehicle, the transducer 18 being coupled to the governor 17 by way of the resistor 19. The governor 17 also receives a signal in a manner to be described representing the rotational speed of the engine, and produces an output which is fed by way of a power amplifier 21 to the actuator 14 to determine the output of the pump. This part of the example is not described in any great detail, because numerous known arrangements can be used, and the invention is particularly concerned with the way in which the speed signal is obtained.

Referring now more particularly to the example of the speed transducer means shown in the drawing, there is a transducer 22 coupled to the engine 12 so as to produce output pulses at a frequency proportional to the rotational speed of the engine. These pulses are fed to a square wave circuit 23 which produces a square wave output also at a frequency proportional to engine speed. There is further provided an operational amplifier 24 which is fed by positive and negative supply terminals 25, 26, and has its noninverting input terminal connected to a supply line 27 at a potential between the potentials of the terminals 25, 26. The square wave circuit 23 is connected to the inverting input terminal of the amplifier 24 through a resistor 30, a capacitor 28, the anode-cathode of a diode 31 and a resistor 29 in series, and the junction of the capacitor 28 and diode 31 is connected to the line 27 through the cathode-anode of a diode 32. The junction of the diode 31 and resistor 29 is connected through a capacitor 33 to the line 27, and the output terminal of the amplifier 24 is coupled through a resistor 34 to the governor 17, the resistor 34 being bridged by a resistor 35 and a capacitor 36 in series. The feedback resistor for the amplifier is shown at 37 and is coupled between the output terminal of the amplifier 24 and the junction of the diode 31 and resistor 29. Moreover, a capacitor 38 is connected between the output terminal of the amplifier 24 and its inverting input terminal.

The capacitor 28, the diodes 31, 32 and the capacitor 38 form a diode pump circuit with the output capacitor 38 connected between the inverting and output terminals of the amplifier 24. This diode pump circuit, in conjunction with the amplifier 24 and its feedback resistor 37, produces a d.c. voltage which is fed by way of the resistor 34 to the governor 17. The resistor 29 and capacitor 33 substantially reduce the ripple at the output of the amplifier 24, as compared with an arrangement in which the capacitor 33 is omitted and the resistor 29 is also omitted so that the diode 31 is coupled directly to the inverting input terminal of the amplifier 24. Because the ripple content has been reduced substantially, it is possible to provide to the governor 17 not only the required speed signal by way of the resistor 34, but the differential of this speed signal, which is provided by virtue of the resistor 35 and capacitor 36. Since the governor 17 also receives the differential signal, the overall stability and speed of response of the system are considerably increased.

The operational amplifier 24 and its associated components can be regarded as two separate circuits. Taking the operational amplifier 24 and its resistor 37 then the addition of the capacitors 33 and 38 and the resistor 29 provides a filter circuit. Starting again with the amplifier 24 and its resistor 37, then the addition of the diodes 31, 32 and the capacitors 28, 38 converts the arrangement into a diode pump circuit with the unusual feature that the output capacitor 38 is connected across the output and inverting input terminals of the amplifier 24. The arrangement shown has effectively combined these two circuits, the diode pump circuit and the filter circuit, into a single circuit with the capacitor 38 common to both. It will be appreciated that by suitable selection of the components 29, 33, 37 and 38 the arrangement can be made to give optimum response for a given system. For example, the design can be such that minimum phase shift occurs at the operating frequencies of the system for maximum attenuation of the ripple content at the output terminal of the amplifier 24.

It should be noted that the resistor 30 and capacitor 28 can be interchanged without altering the operation of the circuit. Also, the polarity of the diodes 31 and 32 can be reversed, in which case the output polarity of the amplifier 24 is reversed. The capacitor 33 is shown connected to the line 27, but could in fact be connected to the terminal 25 or to the terminal 26.

I claim:

1. A frequency to voltage converter comprising in combination an input terminal to which an a.c. signal is fed, an operational amplifier which is powered by first and second supply lines, and has its non-inverting input terminal connected to a third supply line at a potential between the potentials of the first and second lines, the output from the converter being taken from the output terminal of the operational amplifier, a resistor connected in series with first and second similarly poled diodes between the inverting input terminal of the amplifier, and the third line, a first capacitor connected between the input terminal and the junction of the diodes, a second capacitor connected between the junction of the first diode and the resistor and one of the supply lines, a feedback resistor connected between the output terminal of the amplifier and the junction of the first diode and resistor, and a third capacitor connecting the output and inverting input terminals of the amplifier.

2. A fuel supply system for an engine comprising in combination a pump supplying fuel to the engine, a first transducer measuring pump output, a second transducer measuring demand, transducer means measuring engine speed, and an electronic governor to which the signals from the first and second transducers and the transducer means are supplied, the governor controlling the pump output, said transducer means comprising a pulse generator producing pulses at a frequency dependent upon the rotational speed of the engine, an operational amplifier which is powered by first and second supply lines, and has its output terminal connected to the governor and its non-inverting input terminal connected to a third supply line at a potential between the potentials of the first and second lines, a resistor connected in series with first and second similarly poled diodes between the inverting input terminal of the amplifier and the third line, a first capacitor connected between the output of the pulse generator and the junction of the diodes, a second capacitor connected between the junction of the first diode and the resistor and one of the supply lines, a feedback resistor connected between the output terminal of the amplifier and the junction of the first diode and resistor, and a third capacitor connecting the output and inverting input terminals of the amplifier.

3. A fuel supply system as claimed in claim 2 including a further resistor through which the output terminal of the operational amplifier is connected to the electronic governor and a differentiating circuit bridging said further resistor whereby a derivative term is also supplied to the governor.

4. A fuel supply system as claimed in claim 3 in which said differentiating circuit comprises a capacitor and a resistor in series.

* * * * *